(12) United States Patent
Duebel

(10) Patent No.: US 6,775,904 B1
(45) Date of Patent: Aug. 17, 2004

(54) SUPPORTING PIN FOR SUPPORTING SUBSTRATES IN AUTOMATIC EQUIPMENT UNITS

(75) Inventor: Rainer Duebel, Baldham (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/535,489

(22) Filed: Mar. 24, 2000

(30) Foreign Application Priority Data

Jul. 16, 1999 (DE) .......................................... 199 33 538

(51) Int. Cl.⁷ ............................................. H01K 43/00
(52) U.S. Cl. ..................... 29/760; 29/743; 29/281.1; 29/790; 269/903; 269/266
(58) Field of Search .................. 29/760, 759, 765, 29/281.1, 790, 744, 743; 269/54.1, 54.3, 54.5, 70, 53, 903, 266, 296, 22; 414/737, 752

(56) References Cited

U.S. PATENT DOCUMENTS

| | | | | | |
|---|---|---|---|---|---|
| 3,018,098 | A | * | 1/1962 | Hunt .......................... 269/91 |
| 4,494,662 | A | * | 1/1985 | Clymer ..................... 272/134 |
| 4,684,113 | A | * | 8/1987 | Douglas et al. ............... 269/21 |
| 4,804,433 | A | * | 2/1989 | Smith ......................... 156/359 |
| 5,005,814 | A | * | 4/1991 | Gumbert ...................... 269/309 |
| 5,257,654 | A | * | 11/1993 | Bean et al. .................. 144/136 |
| 5,566,840 | A | * | 10/1996 | Waldner et al. ............... 211/41 |
| 5,984,293 | A | * | 11/1999 | Abrahamson et al. ....... 269/266 |
| 6,035,522 | A | * | 3/2000 | Larson et al. ................ 29/760 |
| 6,176,008 | B1 | * | 1/2001 | Ueoka ......................... 29/743 |
| 6,293,534 | B1 | * | 9/2001 | Leban ........................ 269/309 |
| 6,497,403 | B2 | * | 12/2002 | Ries ........................... 269/266 |

FOREIGN PATENT DOCUMENTS

| | | | |
|---|---|---|---|
| JP | 2-190000 | 7/1990 | |
| JP | 4-293300 | 10/1992 | |
| JP | 6-170674 | * 6/1994 | ................. 269/53 |
| JP | 6-209195 | 7/1994 | |
| JP | 9-181496 | 7/1997 | |
| JP | 10-335184 | * 12/1998 | |

* cited by examiner

Primary Examiner—Minh Trinh
(74) Attorney, Agent, or Firm—Bell, Boyd & Lloyd

(57) ABSTRACT

Substrates are supported by height-adjustable supporting pins in automated equipping units. The supporting pins are composed of a tip and a foot part that is spring-borne relative to the tip. When the supporting pins are placed against an underside of the substrate, the supporting pins individually adapt to the contour of the underside of the substrate. The height position of the supporting pins is subsequently fixed. As a result, substrates having position and surface variations can be protected against sagging upon placement of components on the substrates during an automated equipping process.

6 Claims, 2 Drawing Sheets

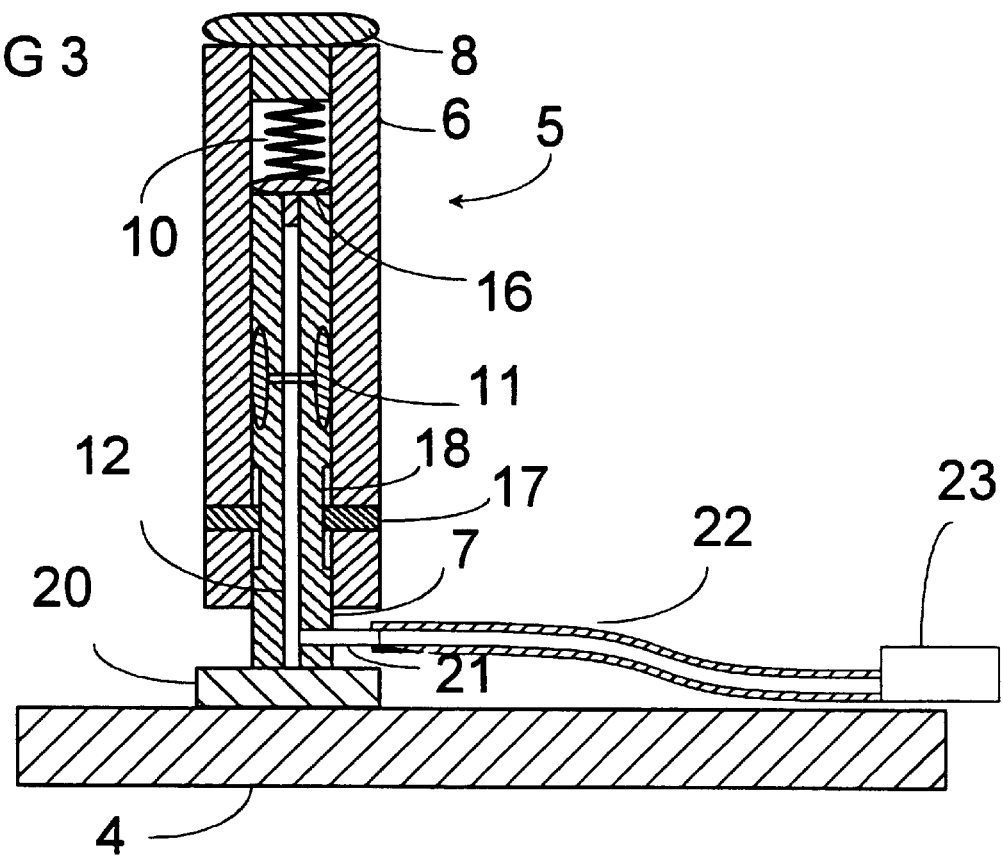

SUPPORTING PIN FOR SUPPORTING SUBSTRATES IN AUTOMATIC EQUIPMENT UNITS

BACKGROUND OF THE INVENTION

The present invention is directed to a method and an apparatus for supporting substrates in automatic equipping units, and more particularly to a method and an apparatus for supporting substrates that can adapt to particular substrate characteristics and then be set or fixed during equipping of the particular substrate with components.

When equipping substrates, such as printed circuit boards, with surface-mountable components, such as SMD components, automatic equipping units take the SMD components from delivery units and place them onto substrates in a predetermined position. Firmly clamped at two sides, a substrate usually rests on a conveyor belt within the automatic equipping unit. The substrates, particularly the printed circuit boards, are not ideally planar in practice, but instead sag either upward or downward by up to approximately 3 mm. Due to the mass of the substrates, very large and especially thin printed circuit boards usually sag down. Also, since the components are pressed onto the substrate with a certain placement force in order to adhere them to the substrate via an adhesive medium (for example, a solder paste, an adhesive or a fluxing agent), the suction pipette of the equipping unit presses the substrate down and thereby bends it downward. Dependent on the desired placement force and rigidity of the substrate, this sag can be on the order of millimeters. Due to ever increasing machine outputs, additionally, the placement speed of the suction pipette is so high that the substrate can be excited to vertical oscillations as though hit by a hammer. These oscillations are harmful for the component that is being equipped or placed by the suction pipette because the rebound of the substrate in an upward direction causes additional impact on the component that is not controllable and can destroy sensitive component parts.

The effects on the placement precision are not beneficial given larger component parts having a fine grid of terminal legs. When the substrate bends down, the component is often torn from the pipette when the adhesion of the adhesive medium on the plate is higher then the suction force of the pipette. Alternatively, the substrate is often whipped upward again by the adhesive medium when the suction force of the pipette exceeds the adhesion. This is particularly the case given components that are placed in low-adhesion agents (for example, a thin-bodied fluxing agent). When component parts move laterally or are not accurately or precisely positioned, the substrate can become unuseable in the worst case or can fail during later operation.

In addition, there is a risk that components already seated on the substrate will move laterally or loosen due to the jolts during equipping. This again applies to components using the low-adhesion agents or given especially narrow, high or heavy components having a relatively small adhesion surface area.

Rigid substrate supports have been previously employed in automatic equipping units. As a rule, a plurality of vertically upwardly residing supporting pins of identical length are arranged on a base plate. Before the equipping event, these approach the printed circuit board from below in order to support it. This support, however, only functions when the pins press directly against the printed circuit board. The supporting pins must therefore be moved up to such an extent with an accurate, reproduceable and adjustable drive until they just touch the substrate. This, however, is not possible in practice due to the addition of the aggregate tolerances of substrate seating height of the lifting drive, and of the planar surface tolerance or variation of the base plate over the entire surface.

For supporting a specific substrate, the supporting pins must be positioned at only those locations on the substrate that are free of components. No components can be equipped where the substrate is supported because the supporting pins could otherwise strike the components and damage them. When this happens at the edge in the proximity of the clamping, the substrate is forceably pressed up by the component height and is potentially likewise damaged.

The employment of fixed substrate supports is therefore difficult, inaccurate and labor intensive for the user which requires trained and especially conscientious operating personnel. This is all the more complex when, for example, anywhere from three to ten different substrate types are to be produced daily, whereby the arrangement of the supports must be changed exactly as often at every automatic equipping unit of a line.

SUMMARY OF THE INVENTION

One object of the present invention is to provide a method for supporting substrates in automated equipping units that can adapt to substrate surface and position variations. Another object of the present invention is to provide an apparatus for supporting substrates in automated equipping units that can adapt to surface and positional variations of the substrates. A further object of the present invention is to provide a method and an apparatus for supporting substrates in automated equipping units that utilizes supporting pins that initially can float or move in order to accommodate substrate variations and can also be locked in place during a particular placement operation.

These and other objects, features and advantages are provided by the method and apparatus of the invention. In one embodiment, a method for supporting substrates in automated equipping units includes first fixing the substrate in an equipping position. A base plate having vertically moveable supporting pins is provided whereby tips of the supporting pins each ride or bear on springs so that the tips can move relative to the base plate. The base plate and supporting pins are resiliently pressed against an underside of the substrate from the beneath the substrate. The height position of each of the tips of the supporting pins is then fixed in place.

In one embodiment, the method also includes the step of cancelling or releasing the fixed height positions of the tips of the supporting pins, moving the base plate downward and away from the substrate, and then releasing the substrate from the equipping units.

In one embodiment, the method also includes arranging the supporting pins in a fixed grid on the base plate.

In another embodiment of the invention, an apparatus for supporting substrates in automated equipping units includes a base plate having a plurality of supporting pins arranged thereon. Each of the supporting pins has a tip that is resiliently seated relative to the base plate so that the tip can move relative to the plate. Means are provided for independently and releasably fixing the position of each supporting pin tip relative to the base plate.

In one embodiment, the means for fixing the position of the supporting pin tips comprises a pneumatic break. In another embodiment, the base plate includes compressed air conduits for supplying compressed air for the pneumatic break.

In one embodiment, the supporting pins are arranged in a fixed grid on the base plate.

In one embodiment, each of the supporting pins includes a compressed air connection that is connected via a hose to a central compressed air supply.

In another embodiment of the invention, a base plate is provided for fastening supporting pins in a predetermined grid thereon. The base plate includes compressed air conduits through which the supporting pins arranged on the base plate are supplied with compressed air. This type of base plate is utilized in automated equipping units.

In another embodiment of the invention, supporting pins are provided for supporting substrates in automatic equipping units. The supporting pins are height adjustable in a telescoping manner and can be fixed in a set position.

In one embodiment, each of the supporting pins includes a height adjustable tip that is seated longitudinally and displaceable relative to a foot part of the supporting pin. The height adjustable tip can be fixed relative to the foot part with a switchable clamp mechanism of the foot part. In another embodiment, the clamp mechanism is a pneumatic break and is connected to an activateable compressed air source.

In one embodiment, the upper side of each of the tips comes into contact with a substrate and is in the form of a rubber plug.

In one embodiment, each of the foot parts of the supporting pins is in the form of a tube and each of the tips is also in the form of a tube that laterally surrounds and telescopes over the foot part.

According to the invention, the supporting pins are attached on a base plate. By contrast to the fixed supporting pins of the prior art, each tip of the invention bears on a spring and is moveable relative to the base plate. The lifting table travels a few millimeters farther up than necessary for contacting the substrate underside during operation with the base plate and the supporting pins. As a result, the pins individually retract by a corresponding excess stroke, as needed at each location on the substrate and every individual supporting pin lies against the underside of the substrate with a slight spring force. The pins that thereby encounter a component on the underside of the substrate respectively spring back by the thickness of the component. In the next step, the height position of each of the supporting pins is fixed. Each individual supporting pin subsequently remains fixed at its own height. The substrate is not bent down and caused to vibrate when components are placed on it by the automatic equipping unit because it is fully supported by each pin.

The problems of uncontrolled placement forces due to rebounding of the printed circuit board, of poor placement precision as a result of the component tearing off from the suction pipette or from the adhesive medium, and of slipping of components that have already been placed on the printed circuit board are avoided. The invention also solves problems under other unfavorable conditions. For example, unfavorable conditions occur when the substrate is arbitrarily upwardly or downwardly flexed, when components are already equipped at a location where an individual supporting pin lies against the substrate, when the manufacturing precision of the support or the positioning precision of the lifter drive are poor, or when the operator arranges the supporting pins at unsuitable locations. The supporting pins need not be re-positioned at different locations for every change in product when using the inventive method and apparatus.

These and other objects, features and advantages of the present invention will become apparent upon reviewing the detailed description and the accompanying drawing figures. The embodiments disclosed herein are provided for illustrating aspects of the present invention. These particular embodiments are not intended to limit the scope of the invention in anyway. Modifications and changes can be made to the present invention that fall within the scope of the invention.

BRIEF DESCRIPTION OF THE DRAWINGS

The invention is explained in greater detail on the basis of the exemplary embodiments shown in the drawing figures in which:

FIG. 3 illustrates a cross-section through a supporting pin of the invention given a free or adjustable position on the base plate.

DETAILED DESCRIPTION OF THE PREFERRED EMBODIMENTS

Figure 1:
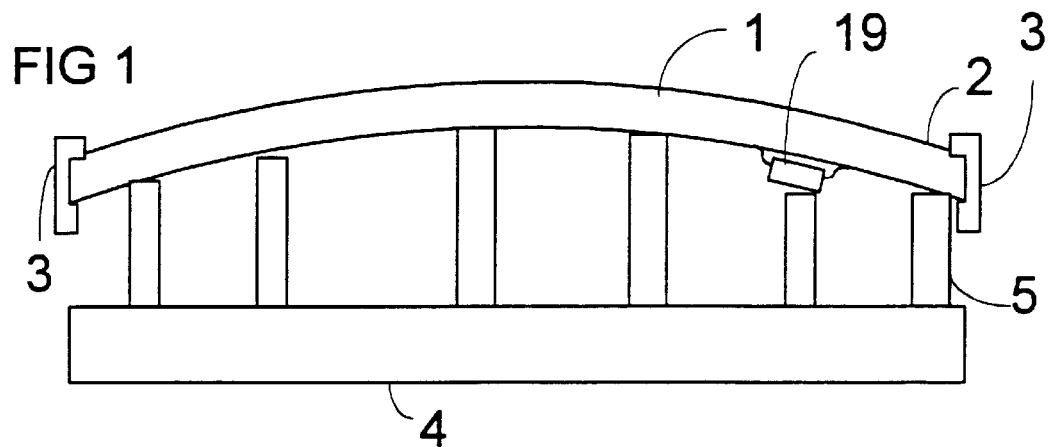
FIG. 1 illustrates a schematic side view of an arcuate substrate that is supported by a number of supporting pins.

In a schematic side view, FIG. 1 shows an upwardly curved substrate 1 that is held at the substrate edges 2 by lateral fixing mechanisms 3. The conveying direction of the substrate 1 of an automatic equipping unit will typically be arranged perpendicular to the plane of the drawing sheet. After the lateral position of the substrate 1 is fixed, a lifter table (not shown) moves a base plate 4 on which a plurality of perpendicularly and upwardly extending supporting pins 5 are arranged in a predetermined grid. The supporting pins can be individually set in terms of height, so that the supporting pins 5 adapt to the contour of the underside of the substrate 1. Due to the individual height adjustment of the supporting pins 5, components 19 already equipped on the underside of the substrate 1 can be taken into consideration, as shown by way of example at the second supporting pin from the right in FIG. 1.

Figure 2:
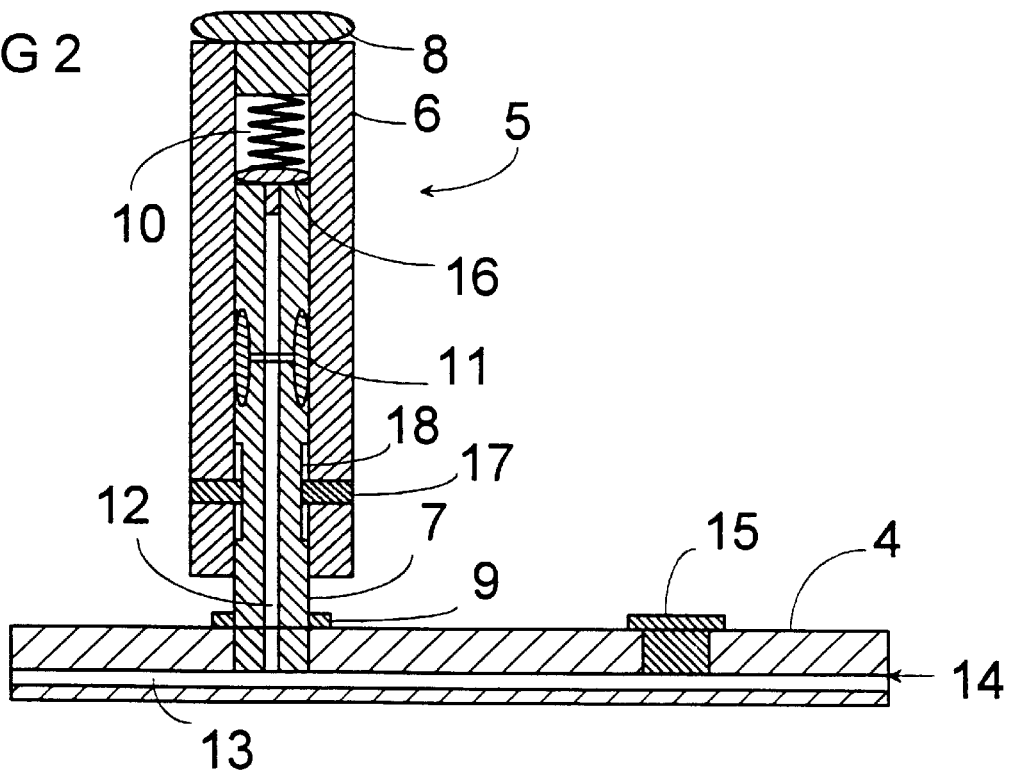
FIG. 2 illustrates a cross-section through a supporting pin of the present invention given a position in a fixed grid on a base plate.

FIG. 2 shows the function of a supporting pin 5 together with a base plate 4 in cross-section. The supporting pin 5 comprises a tip 6 and a foot part 7 that can be displaced easily and telescopically relative to one another. The tip 6 is in the form of a tube and a portion of the tip surrounds the foot part 7. A rubber plug 8 is provided at the upper side of the tip 6, so that no damage to components 19 already equipped at the underside of the substrate 1 occurs upon contact of the supporting pin 5 with the substrate 1.

The foot part 7 is secured to the base plate 4 with a fastening means 9. For example, a screwed connection or some other suitable fastening technique can thereby be provided as the fastening means 9. The tip 6 is coupled to the foot part 7 via a spring 10, so that the tip 6 is resiliently adjustable in height. As the base plate 4 and, thus, the supporting pin 5 move up, the spring 10 is compressed after the tip 6 comes into contact with the substrate 1 or a component such as the component 19. When the base plate 4 is moved as high as provided by the operator, all springs 10 of the supporting pins 5 should be in contact with the substrate and individually compressed as necessary.

In this condition, the height position of the tip 6 relative to the base plate 4 is then fixed. A pneumatic brake 11 in the form of an air cushion is shown for this purpose in FIG. 2. The pneumatic break is operated by compressed air. To this end, a compressed air conduit 12 is provided in the foot part 7 and a compressed air conduit 13 is provided in the base plate 4, these being in communication with one another. A compressed air reservoir 14 (not shown in detail) supplies the compressed air conduits with compressed air. As a result of supplying the compressed air to the conduits 12 and 13, the pneumatic brake 11 is pressed outward and locks the position of the tip 6 relative to the foot part 7. The compressed air conduit 12 in the foot part 7 is closed by a termination 16 at the top end.

A detent 17 can extend into a corresponding recess 18 in the foot part 7 to limit the travel of the tip relative to the foot part 7. Unused holes in the base plate 4 are closed with a plug 15. This embodiment illustrates a fixed grid or fixed position plurality of supporting pins 5.

The compressed air remains turned on during the subsequent equipping process, so that all supporting pins 5 retain their height position. As a result, the uncontrolled placement forces due to the rebounding of the substrate are prevented, and the poor placement precision as a result of the component tearing off from the suction pipette is avoided. Likewise, slippage of components that have already been placed on the substrate is reduced.

A further exemplary embodiment of the supporting pins 5 is shown in FIG. 3. The supporting pins 5 are secured on the base plate 4 by a magnetic material of a magnetic foot 20. As a result, the supporting pins 5 can be freely moved and positioned on the base plate 4, so that an optimum adaptation to the shape of the substrate 1 is achieved. The compressed air is supplied from a central compressed air supply 23 via a compressed air connection 21 at the supporting pin 5 and via a flexible hose 22.

After the equipping process is complete, the compressed air is turned off, so that the supporting pins 5 return into their spring-extended condition when the lifter table moves away from the base plate 4. Subsequently, the substrate 1 is also no longer laterally fixed and can be further-conveyed.

Changes and modifications can be made to the disclosed embodiments. These changes and modifications are intended to fall within the scope of the present invention. The disclosed embodiments and drawing figures are provided in order to illustrate the invention and not in order to limit the scope of the invention. Therefore, the scope of the invention is to be limited only by the appended claims.

I claim:

1. A supporting pin for supporting substrates in automatic equipping units, the supporting pin comprising:

adjustable relative to the base plate and so that the tip can be fixed at a set height to any position relative to the base plate by a switchable clamp mechanism that is coaxially arranged between the foot part and the tip, wherein the foot part includes the switchable clamp mechanism and wherein the switchable clamp mechanism is a pneumatic brake and is connected to an activatable compressed air source.

2. A supporting pin for supporting substrates in automatic equipping units, the supporting pin comprising:

adjustable relative to the base plate and so that the tip can be fixed at a set height to any position relative to the base plate by a switchable clamp mechanism that is coaxially arranged between the foot part and the tip, wherein an upper side of the tip that contacts the substrates includes a rubber plug.

3. A supporting pin for supporting substrates in automatic equipping units, the supporting pin comprising:

adjustable relative to the base plate and so that the tip can be fixed at a set height to any position relative to the base plate by a switchable clamp mechanism that is coaxially arranged between the foot part and the tip, wherein the foot part is a tube and the tip is a tube, the tip is telescopically received over and laterally surrounds the foot part.

4. A supporting pin for supporting substrates in automatic equipping units, the supporting pin comprising:

adjustable relative to the base plate and so that the tip can be fixed at a set height to any position relative to the base plate wherein the supporting pin is individually set in terms of height by a respective switchable clamp mechanism that is coaxially arranged between the foot part and the tip, wherein the foot part includes the switchable clamp mechanism that is a pneumatic brake and is connected to an activatable compressed air source.

5. A supporting pin for supporting substrates in automatic equipping units, the supporting pin comprising:

adjustable relative to the base plate and so that the tip can be fixed at a set height to any position relative to the base plate wherein the supporting pin is individually set in terms of height by a respective switchable clamp mechanism that is coaxially arranged between the foot part and the tip, wherein an upper side of the tip that contacts the substrates includes a rubber plug.

6. A supporting pin for supporting substrates in automatic equipping units, the supporting pin comprising:

adjustable relative to that the tip can be fixed at a set height to any position relative to the supporting pin is individually set in terms of height by a respective switchable clamp mechanism that is coaxially arranged between the foot part and tip, wherein the foot part which is a tube and the tip is a tube, and wherein the tip is telescopically received over and laterally surrounds the foot part.

* * * * *